(12) United States Patent
Kikuchi

(10) Patent No.: US 7,973,356 B2
(45) Date of Patent: Jul. 5, 2011

(54) NONVOLATILE SEMICONDUCTOR MEMORY AND METHOD OF MANUFACTURING THE SAME

(75) Inventor: Takeshi Kikuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 10 days.

(21) Appl. No.: 12/285,167

(22) Filed: Sep. 30, 2008

(65) Prior Publication Data

US 2009/0090962 A1 Apr. 9, 2009

(30) Foreign Application Priority Data

Oct. 4, 2007 (JP) .................. 2007-261391

(51) Int. Cl.
*H01L 29/792* (2006.01)
*H01L 21/8247* (2006.01)
(52) U.S. Cl. .............. 257/324; 257/326; 257/E29.3; 257/E29.309; 438/261; 438/267
(58) Field of Classification Search ........ 257/E29.3, 257/E29.302, E29.304, E27.103, 320, 321, 257/319, 316, E29.309, 324, 326; 438/261, 438/267
See application file for complete search history.

(56) References Cited

U.S. PATENT DOCUMENTS

| | | | | |
|---|---|---|---|---|
| 5,177,571 A * | 1/1993 | Satoh et al. | ............ | 257/336 |
| 5,196,722 A * | 3/1993 | Bergendahl et al. | ......... | 257/304 |
| 5,303,186 A * | 4/1994 | Yamauchi | ............... | 365/185.08 |
| 5,399,516 A * | 3/1995 | Bergendahl et al. | ......... | 438/589 |
| 5,923,976 A * | 7/1999 | Kim | ............... | 438/261 |
| 6,908,817 B2 * | 6/2005 | Yuan | ............... | 438/264 |
| 7,026,684 B2 * | 4/2006 | Sakuma et al. | ............... | 257/315 |
| 7,183,153 B2 * | 2/2007 | Lutze et al. | ................ | 438/201 |
| 7,374,996 B2 * | 5/2008 | Kuo et al. | ............ | 438/259 |
| 7,436,019 B2 * | 10/2008 | Lutze et al. | ................ | 257/315 |
| 7,494,870 B2 * | 2/2009 | Chien et al. | ............... | 438/257 |
| 7,495,282 B2 * | 2/2009 | Orimoto et al. | ............... | 257/315 |
| 7,504,686 B2 * | 3/2009 | Lutze et al. | ................ | 257/314 |
| 7,512,005 B2 * | 3/2009 | Mokhlesi | ................ | 365/185.17 |
| 7,517,756 B2 * | 4/2009 | Yuan | ............... | 438/257 |
| 7,560,768 B2 * | 7/2009 | Koh et al. | ................ | 257/316 |
| 7,582,529 B2 * | 9/2009 | Matamis et al. | ............... | 438/258 |
| 7,588,982 B2 * | 9/2009 | Sandhu et al. | ............... | 438/257 |
| 7,589,374 B2 * | 9/2009 | Song et al. | ................ | 257/315 |
| 7,592,223 B2 * | 9/2009 | Pham et al. | ................ | 438/258 |

(Continued)

FOREIGN PATENT DOCUMENTS

JP 03-177075 * 8/1991

(Continued)

*Primary Examiner* — Mary Wilczewski
(74) *Attorney, Agent, or Firm* — McGinn IP Law Group, PLLC

(57) ABSTRACT

A nonvolatile semiconductor memory device includes: a semiconductor substrate; a first gate electrode formed on the semiconductor substrate through a gate insulating film; a second gate electrode formed in a side direction of the first gate electrode and electrically insulated from the first gate electrode; and an insulating film formed at least between the semiconductor substrate and the second gate electrode to trap electric charge, as an electric charge trapping film. The first gate electrode comprises a lower portion contacting the gate insulating film and an upper portion above the lower portion of the first gate electrode, and a distance between the upper portion of the first gate electrode and the second gate electrode is longer than a distance between the lower portion of the first gate electrode and the second gate electrode.

12 Claims, 19 Drawing Sheets

U.S. PATENT DOCUMENTS

| | | | |
|---|---|---|---|
| 7,615,445 B2 * | 11/2009 | Chien et al. | 438/257 |
| 7,615,447 B2 * | 11/2009 | Purayath et al. | 438/257 |
| 7,619,276 B2 * | 11/2009 | Zhu | 257/316 |
| 7,667,260 B2 * | 2/2010 | Sandhu et al. | 257/316 |
| 7,678,650 B2 * | 3/2010 | Koh et al. | 438/257 |
| 2005/0003616 A1 * | 1/2005 | Lutze et al. | 438/258 |
| 2005/0212034 A1 * | 9/2005 | Sasago et al. | 257/315 |
| 2006/0292802 A1 * | 12/2006 | Lee et al. | 438/264 |
| 2008/0105916 A1 * | 5/2008 | Watanabe | 257/315 |
| 2008/0149987 A1 * | 6/2008 | Alapati et al. | 257/315 |
| 2008/0173925 A1 * | 7/2008 | Kuo et al. | 257/315 |
| 2008/0237680 A1 * | 10/2008 | Pangal et al. | 257/315 |
| 2008/0239827 A1 * | 10/2008 | Mokhlesi | 365/185.28 |
| 2008/0261365 A1 * | 10/2008 | Sasago et al. | 438/257 |
| 2009/0035905 A1 * | 2/2009 | Alapati et al. | 438/264 |
| 2009/0130835 A1 * | 5/2009 | Lai et al. | 438/594 |
| 2009/0146203 A1 * | 6/2009 | Izumida et al. | 257/316 |
| 2009/0147576 A1 * | 6/2009 | Matamis et al. | 365/185.05 |
| 2009/0163008 A1 * | 6/2009 | Purayath et al. | 438/586 |
| 2009/0215256 A1 * | 8/2009 | Hsueh et al. | 438/594 |
| 2009/0261397 A1 * | 10/2009 | Willer et al. | 257/316 |
| 2009/0261398 A1 * | 10/2009 | Chien et al. | 257/316 |
| 2009/0273017 A1 * | 11/2009 | Willer et al. | 257/319 |
| 2010/0062603 A1 * | 3/2010 | Ganguly et al. | 438/694 |
| 2010/0081267 A1 * | 4/2010 | Purayath et al. | 438/594 |

FOREIGN PATENT DOCUMENTS

JP     2005-260164     9/2005

* cited by examiner

<PROGRAM>

<ERASE>

<READ>

NONVOLATILE SEMICONDUCTOR MEMORY AND METHOD OF MANUFACTURING THE SAME

INCORPORATION BY REFERENCE

This application claims priority on convention based on Japanese Patent Application No. 2007-261391. The disclosure thereof is incorporated herein by reference.

BACKGROUND OF THE INVENTION

1. Field of the Invention

The present invention relates to a nonvolatile semiconductor memory and a method of manufacturing the same. The present invention especially relates to a nonvolatile semiconductor memory which can electrically erase/write data and to a method of manufacturing the same.

2. Description of Background Art

As a nonvolatile semiconductor memory which can electrically erase and write data, a flash memory and a charge trapping memory are known. The charge trapping memory stores data by using an element for trapping electric charge. The element for trapping electric charge is, for example, a MONOS (Metal oxide Nitride Oxide Silicon) transistor. The MONOS transistor is a sort of a MIS (Metal Insulator Semiconductor) transistor, and uses an ONO (Oxide Nitride Oxide) film in which a silicon oxide film, a silicon nitride film, and a silicon oxide film are laminated in order as a gate insulating film.

The silicon nitride film of the ONO film has a characteristic of trapping electric charge. For example, by applying appropriate voltages to a gate electrode, a source and drain, and a substrate, the silicon nitride film can trap electrons. When the electrons are trapped by the silicon nitride film, a threshold voltage of the MONOS transistor increases compared to a case that any electron is not trapped. To the contrary, when the trapped electrons are drawn from the silicon nitride film, the threshold voltage decreases. The MONOS transistor can store data of "1" and "0" in a nonvolatile manner by using a change of the threshold voltage. That is, the charge trapping memory stores data by using the MONOS transistor as a memory cell.

In recent years, a charge trapping memory can store 2-bit data in one memory cell has also been develop, as described in Japanese Patent Application Publication (JP-P2005-260164A).

FIG. 1 is a sectional view showing a charge trapping memory described in Japanese Patent Application Publication (JP-P2005-260164A). In FIG. 1, a memory cell 102 is formed on a silicon substrate 101. The memory cell 102 includes two MONOS transistors. In more detailed, source/drain diffusion layers 103 are formed in a surface of the silicon substrate 101. A first gate electrode 106 is formed via a gate insulating film 105 on a part of a channel region 104 between the source/drain diffusion layers 103. An ONO film 107 is formed in an L-shape on either end of a first gate electrode 106, and a second gate electrode 108 is formed on each of the ONO films 107. That is, the respective ONO films 107 are formed between the second gate electrode 108 and the channel region 104 and between the second gate electrode 108 and the first gate electrode 106. The ONO film 107 functions as an electric charge trapping layer for trapping electric charge. Thus, 2-bit data is stored in one memory cell 102.

Moreover, in FIG. 1, a first silicide layer 109 is formed on a center of an upper surface of the first gate electrode 106. In addition, a second silicide layer 110 is formed on the second gate electrode 108. As shown in FIG. 1, a height of a top of the second gate electrode 108 is higher than a height of a top of the first gate electrode 106. For this reason, a short-circuit between the first silicide layer 109 and the second silicide layer 110 is avoided in the formation of the silicide. That is, the resistance value of the second gate electrode 108 can be reduced while insulating the second gate electrode 108 from the first gate electrode 106.

SUMMARY

In an aspect of the present invention, a nonvolatile semiconductor memory device includes: a semiconductor substrate; a first gate electrode formed on the semiconductor substrate through a gate insulating film; a second gate electrode formed in a side direction of the first gate electrode and electrically insulated from the first gate electrode; and an insulating film-formed at least between the semiconductor substrate and the second gate electrode to trap electric charge, as an electric charge trapping film. The first gate electrode comprises a lower portion contacting the gate insulating film and an upper portion above the lower portion of the first gate electrode, and a distance between the upper portion of the first gate electrode and the second gate electrode is longer than a distance between the lower portion of the first gate electrode and the second gate electrode.

In another aspect of the present invention, a nonvolatile semiconductor memory device includes: a semiconductor substrate; a first gate electrode formed through a gate insulating film on the semiconductor substrate; a second gate electrode formed in a side direction of the first gate electrode and electrically insulated from the first gate electrode; and an insulating film formed at least between the semiconductor substrate and the second gate electrode as an electric charge trapping film to trap electric charge. A section shape of the first gate electrode in a plane perpendicular to the semiconductor substrate and a direction in which the first gate electrode extends is perpendicular to the surface of is a convex shape.

In another aspect of the present invention, a method of manufacturing a nonvolatile semiconductor memory device, includes: forming a gate insulating film on a semiconductor substrate; depositing a first polysilicon film on the gate insulating film; etching the first polysilicon film partially in a region other than a predetermined region to form a projection structure of the first polysilicon film in the predetermined region; forming spacer structures on side surfaces of the projection structure; removing the first polysilicon film and the gate insulating film from a region other than a region where the projection structure and the spacer insulating films are formed; forming an electric charge trapping film as an insulating film to trap electric charge; depositing a second polysilicon film on the electric charge trapping film; and etching back the second polysilicon film.

According to a nonvolatile semiconductor memory of the present invention, an operational speed is improved.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a nonvolatile semiconductor memory device of the present invention will be described in detail with reference to the attached drawings.

First Embodiment

Figure 1:
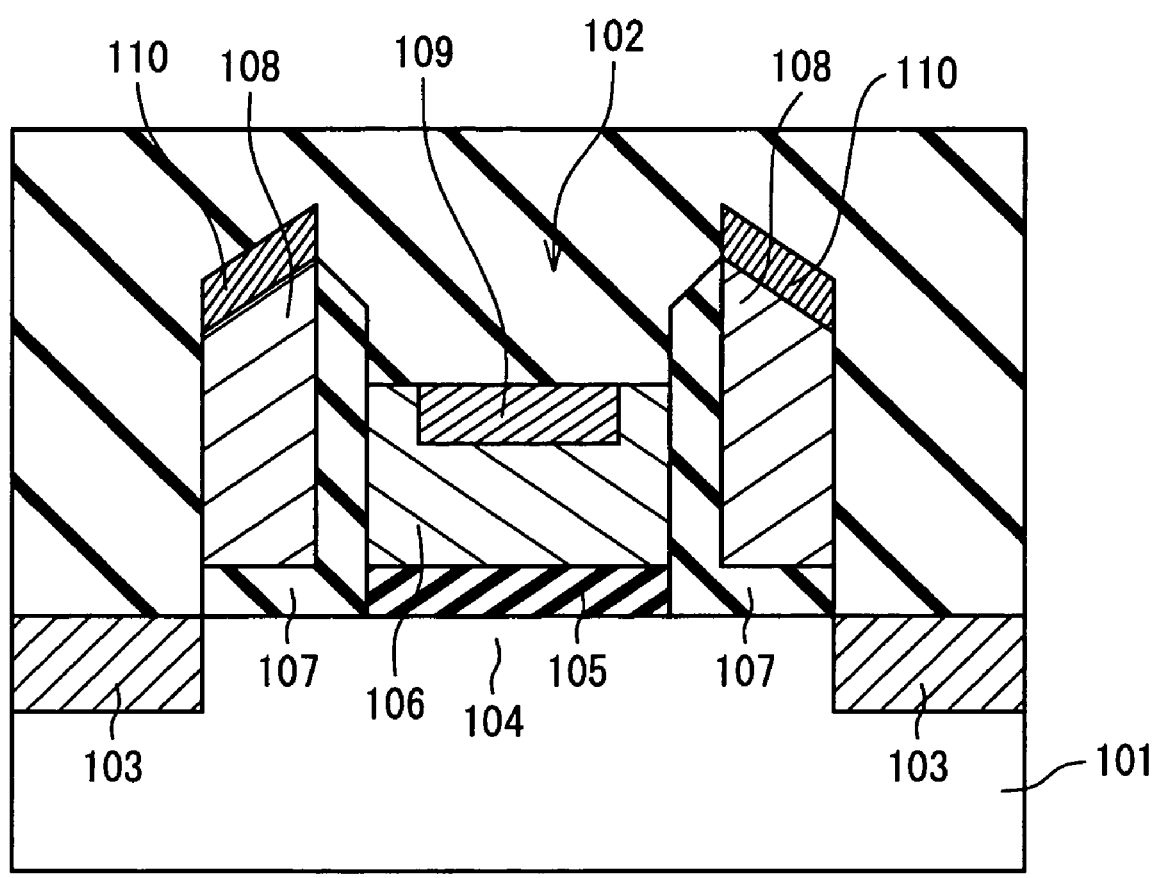
FIG. 1 is a cross sectional view showing a structure of a conventional nonvolatile semiconductor memory device.
Figure 2:
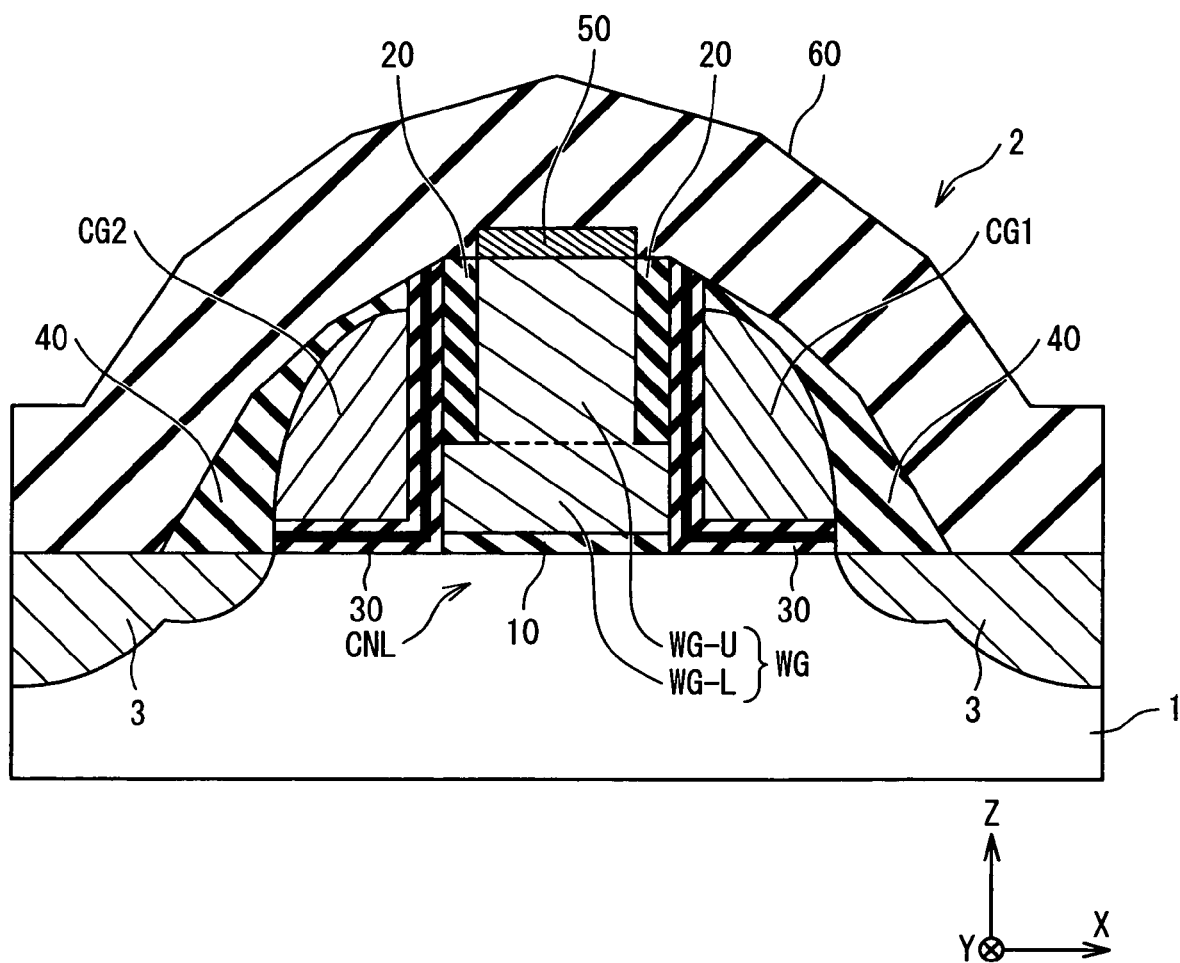
FIG. 2 is a cross sectional view showing a structure of a nonvolatile semiconductor memory device according to a first embodiment of the present invention.

FIG. 2 is a sectional view showing a structure of the nonvolatile semiconductor memory device according to a first embodiment of the present invention. As shown in FIG. 2, a memory cell 2 is formed on a semiconductor substrate 1. The semiconductor substrate 1, for example, is a P-type silicon substrate. Source/drain diffusion layers 3 are formed on a surface of the semiconductor substrate 1. The source/drain diffusion layer 3 is an N-type diffusion layer. A semiconductor region between the source/drain diffusion layers 3 is a channel region CNL.

A word gate WG is formed on a part of the channel region CNL of the semiconductor substrate 1 via a gate insulating film 10 as a first gate electrode. An extending direction of the word gate WG exist is a Y direction. A gate length of the word gate WG is determined along an X direction orthogonal to the Y direction. A direction orthogonal to both of the X direction and the Y direction, that is, a direction orthogonal to a surface of the semiconductor substrate 1 is a Z direction.

In the first embodiment, the word gate WG includes an upper portion WG-U and a lower portion WG-L. The lower portion WG-L contacts the gate insulating film 10. The upper portion WG-U is formed on the lower portion WG-L. As shown in FIG. 2, a width of the upper portion WG-U in the X direction is narrower than a width of the lower portion WG-L in the X direction. That is, the cross sectional shape of the word gate WG on an XZ plane is a convex shape. A spacer insulating film 20 is formed on each of side surfaces of the upper portion WG-U. The spacer insulating film 20 is a silicon oxide film.

An electric charge trapping film 30 is formed on an either side of the word gate WG. The electric charge trapping film 30 is an insulating film for trapping electric charge. The electric charge trapping film 30 is an ONO (Oxide Nitride Oxide) film in which an oxide film, a nitride film, and an oxide film are laminated in order. In this case, the electric charge can be trapped by the nitride film. In addition, only an ON film, an ONON film, or the nitride film may be used as the electric charge trapping film 30.

The electric charge trapping film 30 is formed at least on the channel region CNL between the word gate WG and the source/drain diffusion layer 3. Control gates CG1 and CG2 are formed on the electric charge trapping films 30 as second gate electrodes. That is, the electric charge trapping film 30 is formed between each of the control gates CG1 and CG2 and the channel region CNL of the semiconductor substrate 1. As a result, two MONOS transistors are formed on both sides of the word gate WG. Since the respective MONOS transistors function as memory elements, one memory cell can store 2-bit data.

The electric charge trapping film 30 further exists between the word gate WG and each of the control gates CG1 and CG2. That is, the electric charge trapping film 30 is formed in an L-shape on each side of the word gate WG. As shown in FIG. 2, the electric charge trapping film 30 intervenes between the lower portion WG-L of the word gate WG and each of the control gates CG1 and CG2. On the other hand, the above described spacer insulating film 20 and the electric charge trapping film 30 intervene between the upper portion WG-U of the word gate and each of the control gates CG1 and CG2. Accordingly, a distance between the upper portion WG-U and each of the control gates CG1 and CG2 is larger than a distance between the lower portion WG-L and each of the control gates CG1 and CG2.

As described above, the control gates CG1 and CG2 are formed on both sides of the word gate WG via insulating films. The insulating film is the electric charge trapping film 30 or the spacer insulating film 20 and the electric charge trapping film 30. In addition, a side wall 40 is formed to cover each of the control gates CG1 and CG2.

Furthermore, a silicide layer 50 is formed on the upper portion WG-U of the word gate WG. The silicide layer 50 is formed to entirely cover the upper surface of the word gate WG. The resistance of the word gate WG is reduced by the silicide layer 50. Although being not shown in FIG. 2, the upper surfaces of the control gates CG1 and CG2 may be subjected to a silicidation process. In addition, a surface of the source/drain diffusion layer 3 may be subjected to the silicidation process.

Moreover, an interlayer insulating film 60 is formed to cover the whole of the above-mentioned structure.

(Operation)

Next, write (program), erase, and read operations of the memory cell 2 will be described.

Figure 3:
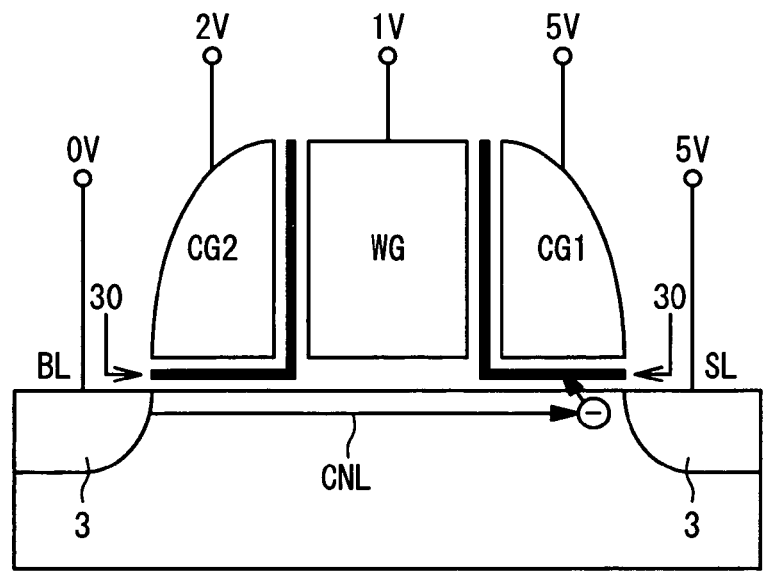
FIG. 3 is a schematic view for explaining a write operation.

FIG. 3 is a diagram schematically showing the writing operation. As an example, the write operation of a data into a bit on the side of control gate CG1 will be described. The source/drain diffusion layer 3 on the side of control gate CG1 is connected to a source line SL, and the source/drain diffusion layer 3 on the side of control gate CG2 is connected to a bit line BL. In the first embodiment, the write operation is performed by a CHE (Channel Hot Electron) method. For example, voltages of +1V, +5V, +2V, +5V, and 0V are applied to the word gate WG, the control gate CG1, the control gate CG2, the source line SL, and the bit line BL, respectively. At this time, the diffusion layer 3 on the side of control gate CG2 functions as a source, and the diffusion layer 3 on the side of control gate CG1 functions as a drain. Channel electrons are accelerated by a strong electric field in the vicinity of the drain to be turned into channel hot electrons. A part of the generated channel hot electrons is injected into the nitride film of the electric charge trapping film 30 under the control gate CG1.

As a result, a threshold voltage of a transistor on the side of control gate CG1 increases to set the transistor to a programmed state.

Figure 4:
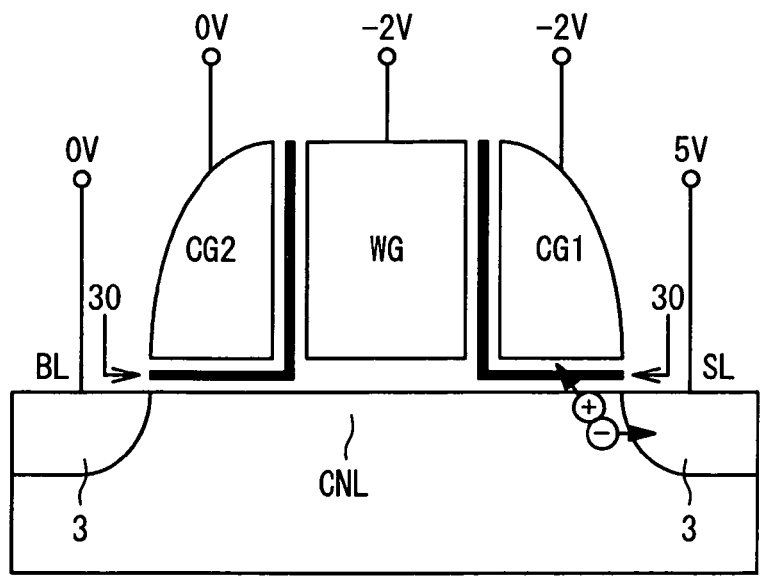
FIG. 4 is a schematic view for explaining an erase operation.

FIG. 4 is a diagram schematically showing the erase operation. As an example, the erase operation of a data of a bit on the side of control gate CG1 will be described. In the first embodiment, the erase operation is performed by an HHI (Hot Hole Injection) method. For example, voltages of −2V, −2V, 0V, +5V, and 0V are applied to the word gate WG, the control gate CG1, the control gate CG2, the source line SL, and the bit line BL, respectively. Since the negative voltage of −2V is applied to the word gate WG, the channel is not formed. On the other hand, since the negative voltage of −2V is applied to the control gate CG1 and the positive voltage of +5V is applied to the source line SL, the strong electric field is generated between the control gate CG1 and the diffusion layer 3. When the strong electric field is applied to a depletion layer around an end portion of the diffusion layer 3, the "Band-to-Band tunnel phenomenon" occurs in the depletion layer. Electron-hole pairs are generated through the Band-to-Band tunnel phenomenon in the depletion layer in which no carriers originally exist. Among the electron-hole pairs, the electrons are attracted to the diffusion layer 3 applied with the voltage of +5V. On the other hand, among the electron-hole pairs, the holes are attracted to the channel region CHL due to the electric field in the depletion layer. At this time, the holes are accelerated with the electric field in the depletion layer to be turned into hot holes. There is a possibility that the generated hot holes collide with a lattice and generates a new electron-hole pair. When the number of the generated electron-hole pairs is more than the number of extinguished electron-hole pairs, avalanche breakdown occurs. Also, through the avalanche breakdown, a large number of hot carriers (hot holes and hot electrons) are generated.

As described above, the large number of hot holes are generated in the depletion layer and the channel region CNL due to the Band-to-Band tunnel phenomenon. The hot holes are attracted to the negative voltage of −2V applied to the control gate CG1. The hot holes with high energy are injected into the nitride film of the electric charge trapping film 30 under the control gate CG1. As a result, a threshold voltage of a transistor on the side of control gate CG1 decreases.

Figure 5:
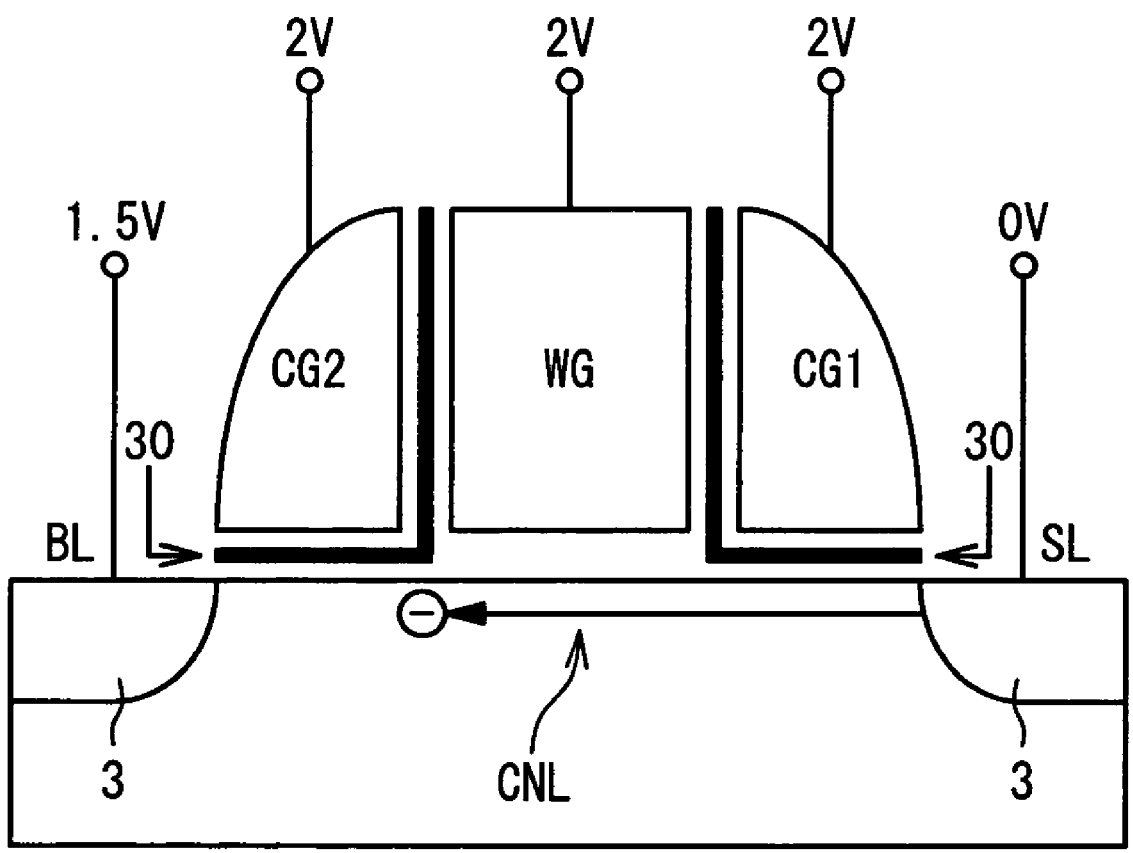
FIG. 5 is a schematic view for explaining a read operation.

FIG. 5 is a diagram schematically showing the read operation. As an example, the read operation of a data of a bit on the side of control gate CG1 will be described. For example, voltages of +2V, +2V, +2V, 0V, and 1.5V are applied to the word gate WG, the control gate CG1, the control gate CG2, the source line SL, and the bit line BL, respectively. At this time, the diffusion layer 3 on the side of control gate CG1 functions as a source, and the diffusion layer 3 on the side of control gate CG2 functions as a drain. Under the programmed state with a large threshold voltage, a transistor on the side of control gate CG1 is turned OFF and the channel is not formed. On the other hand, under an erased state with a small threshold voltage, the transistor on the side of control gate CG1 is turned ON. If carriers reach the channel region CNL under the control gate CG2, the carriers are absorbed into the drain by the depletion layer electric field around the drain. That is, the channel is formed regardless of the data of a bit on the side of control gate CG2. Accordingly, the data of a bit on the side control gate CG1 can be determined based on current of the bit line BL.

(Manufacturing Method)

FIGS. 6A to 6M are cross sectional views showing a manufacturing method of the nonvolatile semiconductor memory device according to the first embodiment of the present invention.

Figure 6A:
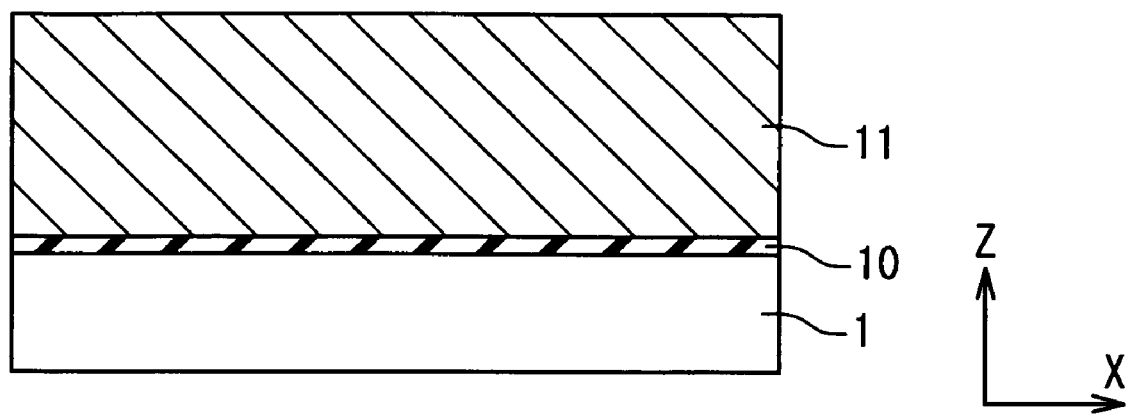
FIGS. 6A to 6M are cross sectional views showing a manufacturing process of the nonvolatile semiconductor memory device in the first embodiment.

In FIG. 6A, the semiconductor substrate 1 is, for example, a P-type silicon substrate. The gate insulating layer 10 is formed on the semiconductor substrate 1 after a device separation structure such as an STI (Shallow Trench Isolation) structure is formed on the semiconductor substrate 1. The gate insulating layer 10 is such as a silicon oxide layer formed by perform a thermal process or an oxidizing process on the surface of the semiconductor substrate 1. Subsequently, a polysilicon layer 11 is deposited on the gate insulating layer 10 as a first polysilicon layer. The polysilicon layer 11 is used for producing the word gate WG.

Figure 6B:
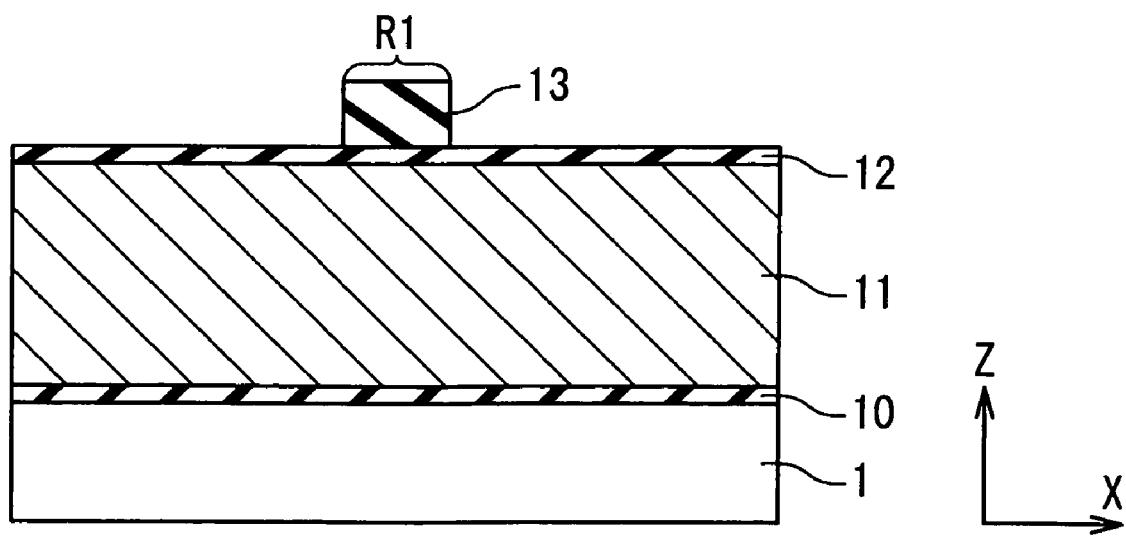

Next, as shown in FIG. 6B, an insulating layer 12 for a hard mask is formed on the polysilicon layer 11. The insulating layer 12 is such as a silicon nitride layer. Further, a resist mask 13 is formed on the insulating layer 12 in a predetermined region R1.

Figure 6C:
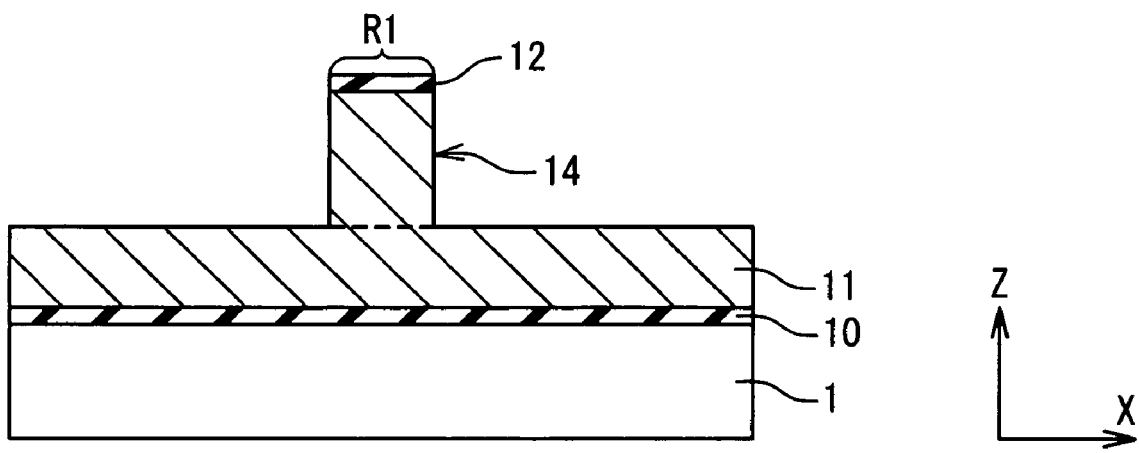

Next, as shown in FIG. 6C, the insulating layer 12 other than the region R1 and a part of the polysilicon layer 11 are removed by an etching using the resist mask 13. In this case, it should be noted that the polysilicon layer 11 other than the region R1 is etched, thus not all the film is removed. As a result, a projection structure 14 including the polysilicon layer 11 is formed in the region R1. The projection structure 14 corresponds to the upper portion WG-U of the word gate WG. In addition, the resist mask 13 is removed.

Figure 6D:
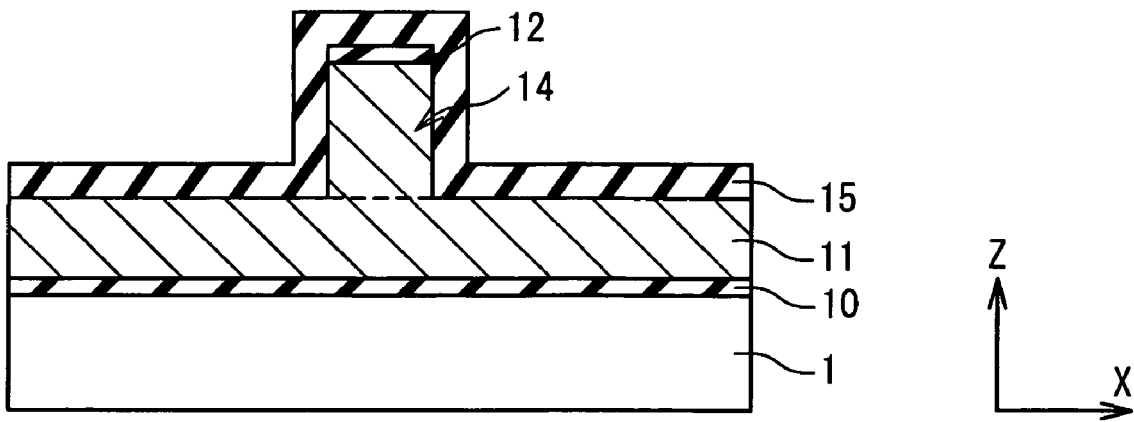
Figure 6E:
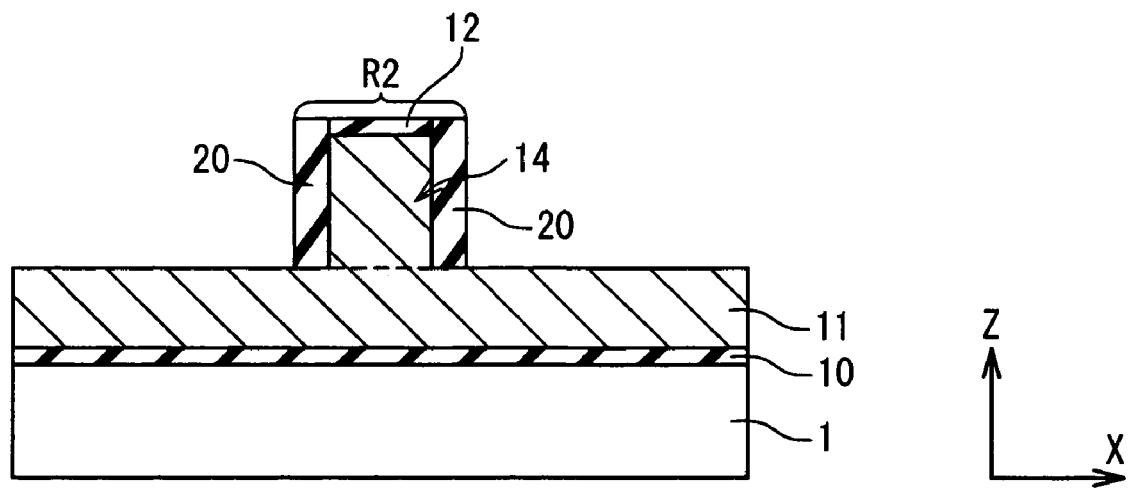

Next, as shown in FIG. 6D, an insulating layer 15 is deposited on an entire surface. The insulating layer 15 is a silicon oxide layer. Subsequently, etching back of the insulating layer 15 is performed. As a result, as shown in FIG. 6E, the spacer insulating films 20 are formed on each of side surfaces of the projection structure 14. A region in which an insulating film 12, the projection structure 14, and the spacer insulating films 20 are formed is referred to as a "region R2" below.

Figure 6F:
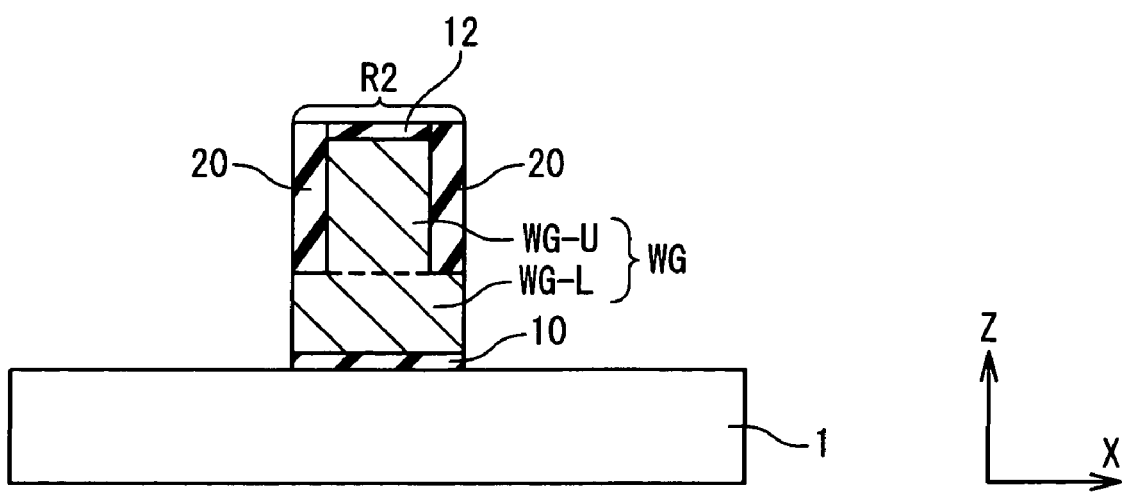

Next, as shown in FIG. 6F, the polysilicon layer 11 and the gate insulating layer 10 are removed a region other than the region R2 by etching using the insulating film 12 and the spacer insulating films 20 as a mask. As a result, the word gate WG is formed. The word gate WG includes the upper portion WG-U and the lower portion WG-L. A cross sectional shape of the word gate WG on an XZ plane is a step-like convex shape. The spacer insulating film 20 is formed on each side surface of the upper portion WG-U.

Figure 6G:
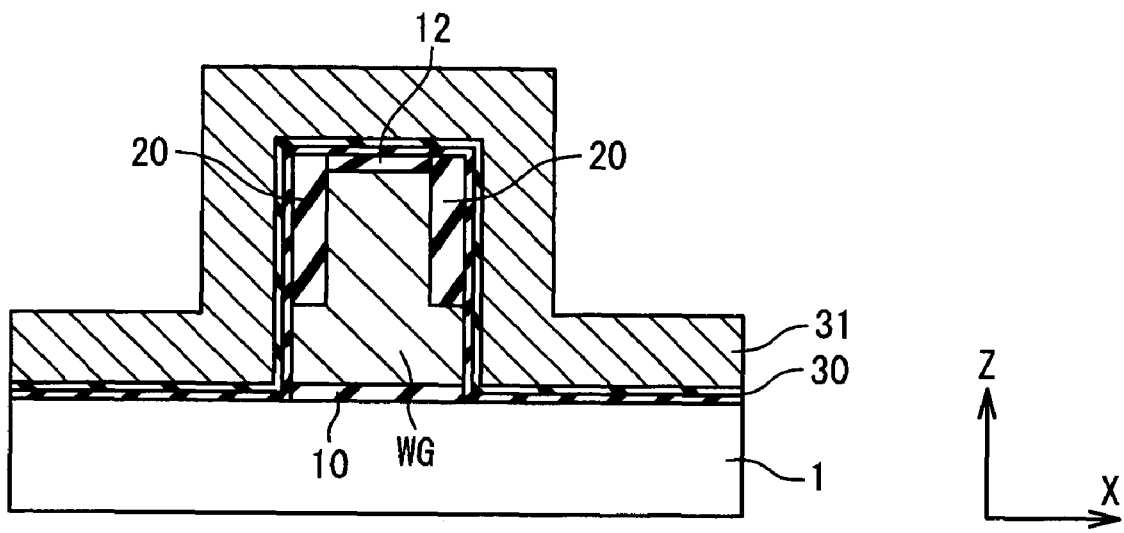

Next, as shown in FIG. 6G, the electric charge trapping layer 30 is formed on the entire surface. The electric charge trapping layer 30 is an ONO layer in which a silicon oxide layer, a silicon nitride layer, and a silicon oxide layer are laminated in order. Further, a polysilicon layer 31 is deposited on the electric charge trapping layer 30 as a second polysilicon layer. The polysilicon layer 31 is used to produce the control gates CG1 and CG2.

Figure 6H:
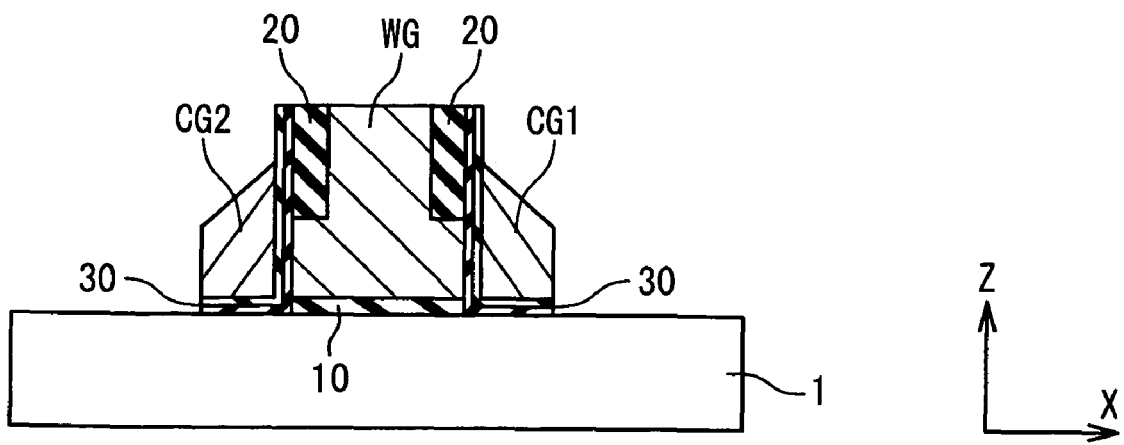
Figure 6I:
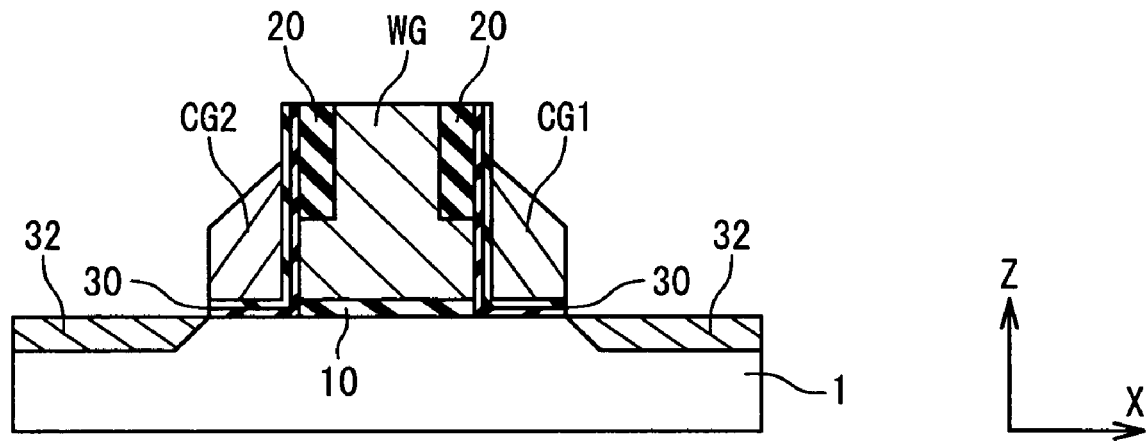

Subsequently, the etching back of the polysilicon layer 31 is performed. As a result, as shown in FIG. 6H, the control gates CG1 and CG2 are formed on both sides of the word gate WG. That is, the control gates CG1 and CG2 are formed in side directions of the word gate WG. Further, in this case, the electric charge trapping layer 30 is etched until a part of the semiconductor substrate 1 is exposed. Thus, electric charge trapping films 30 is formed in an L-shape on both sides of the word gate WG. The insulating film 12 is also removed.

Next, an ion implantation process is performed, and an LDD (Lightly Doped Drain) structure 32 of the source/drain diffusion layer 3 is formed on the surface of the semiconductor substrate 1. In the ion implantation process, —type impurities such as arsenic are implanted.

Figure 6J:
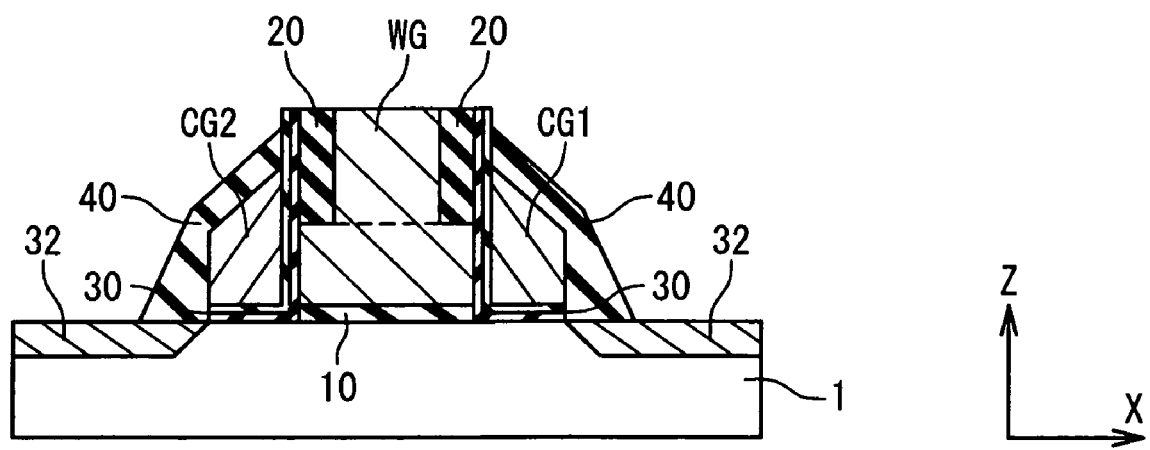

Next, after a silicon oxide layer is deposited on the entire surface, the etching back of the silicon oxide layer is performed. As a result, as shown in FIG. 6J, the side wall 40 is formed to cover the control gates CG1 and CG2.

Figure 6K:
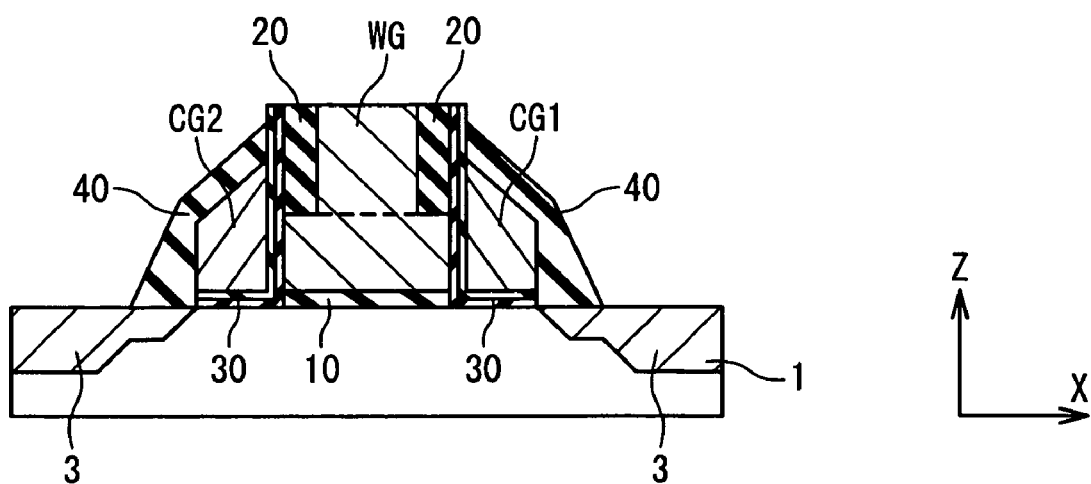

After that, the ion implantation is further performed, and the source/drain diffusion layers 3 are formed on the surface of the semiconductor substrate 1 as shown in FIG. 6K.

Figure 6L:
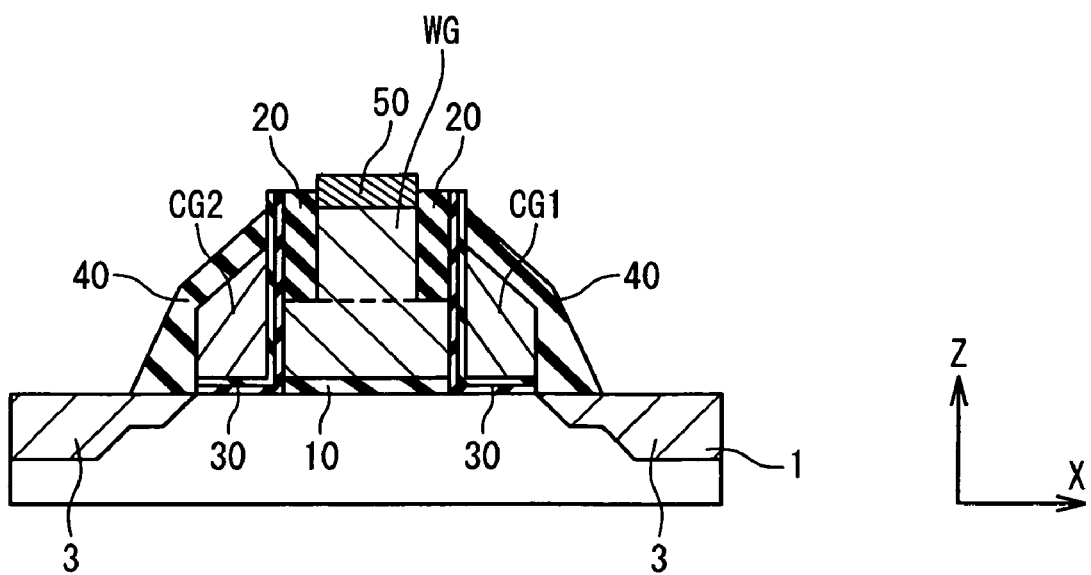

Next, as shown in FIG. 6L, an upper surface of the word gate WG is treated with the silicidation treatment, and the silicide layer 50 is formed. For example, a cobalt film is formed on the entire surface by the sputtering, and then a heat treatment is performed. A cobalt silicide layer is formed by a silicide reaction of the cobalt with the polysilicon of the word gate WG. Meanwhile, since the upper surface of the word gate WG is an open space, the silicide reaction easily proceeds. In addition, other structures do not exist on the upper surface of the word gate WG, the silicide layer 50 is formed to cover the whole of the upper surface of the word gate WG. Accordingly, a resistance of the word gate WG is efficiently reduced.

Figure 6M:
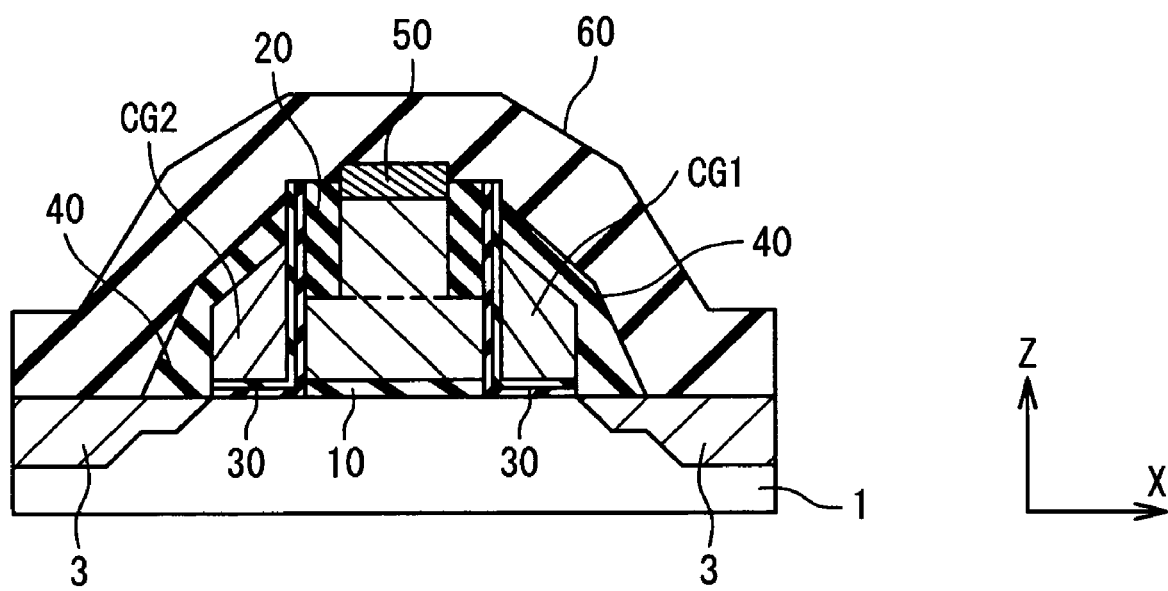

After that, as shown in FIG. 6M, the interlayer insulating layer 60 is formed on the entire surface. Thus, the structure shown in FIG. 2 is obtained.

As described above, according to the present embodiment, the word gate WG includes the lower portion WG-L and the upper portion WG-U. A distance between the upper portion WG-U and the control gate CG1 or CG2 is larger than a distance between the lower portion WG-L and the control gate CG1 or CG2. In other words, the upper portion WG-U of the word gate WG is separated away from the control gates CG1 and CG2 compared to the lower portion WG-L. As a result, a coupling capacitance of the word gate WG and the control gate CG1 or CG2 is reduced in the upper portion WG-U. Since a coupling capacitance between the gate electrodes is reduced, a charging time for+ the gate electrodes (WG, CG1, and CG2) is reduced. As a result, an operation speed of the nonvolatile semiconductor memory device is improved.

On the other hand, the lower portion WG-L contacting the gate insulating film 10 is close to the control gates CG1 and CG2 compared to the upper portion WG-U. Accordingly, a channel is well formed in the channel region CNL. For comparison, a case will be considered that the lower portion WG-L is separated from the control gates CG1 and CG2 as well as the upper portion WG-U. That is, to reduce the coupling capacitance, it is considered to expand a thickness of the insulating film intervening between the word gate WG and the control gates CG1 and CG2. In this case, a channel is not formed well in the semiconductor substrate 1 under the thick insulating film. As a result, a drain current is reduced and an operational property deteriorates. According to the present embodiment, since only the upper portion WG-U is separated from the control gates CG1 and CG2, a channel is formed well in the channel region CNL. Accordingly, reduction of the drain current is avoided.

As described above, in the present embodiment, the coupling capacitance is reduced by avoiding the reduction of the drain current. It can be said that both of the operation speed and the current property of the nonvolatile semiconductor memory device are realized at the same time.

To reduce the coupling capacitance, it can be considered to totally reduce the thickness of the word gate WG. However, when the thickness of the word gate WG is too reduced (for example, 30 nm or less), there is a possibility that all of the polysilicon of the word gate WG is turned to the silicide in the silicide reaction (full silicide). In that case, the silicide contacts the gate insulating film 10 and a leakage current is increased. This leads to a reliability degradation of the nonvolatile semiconductor memory device. To reduce the coupling capacitance while keeping a certain thickness of the word gate WG, the structure according to the present embodiment is preferable.

Second Embodiment

Figure 7:
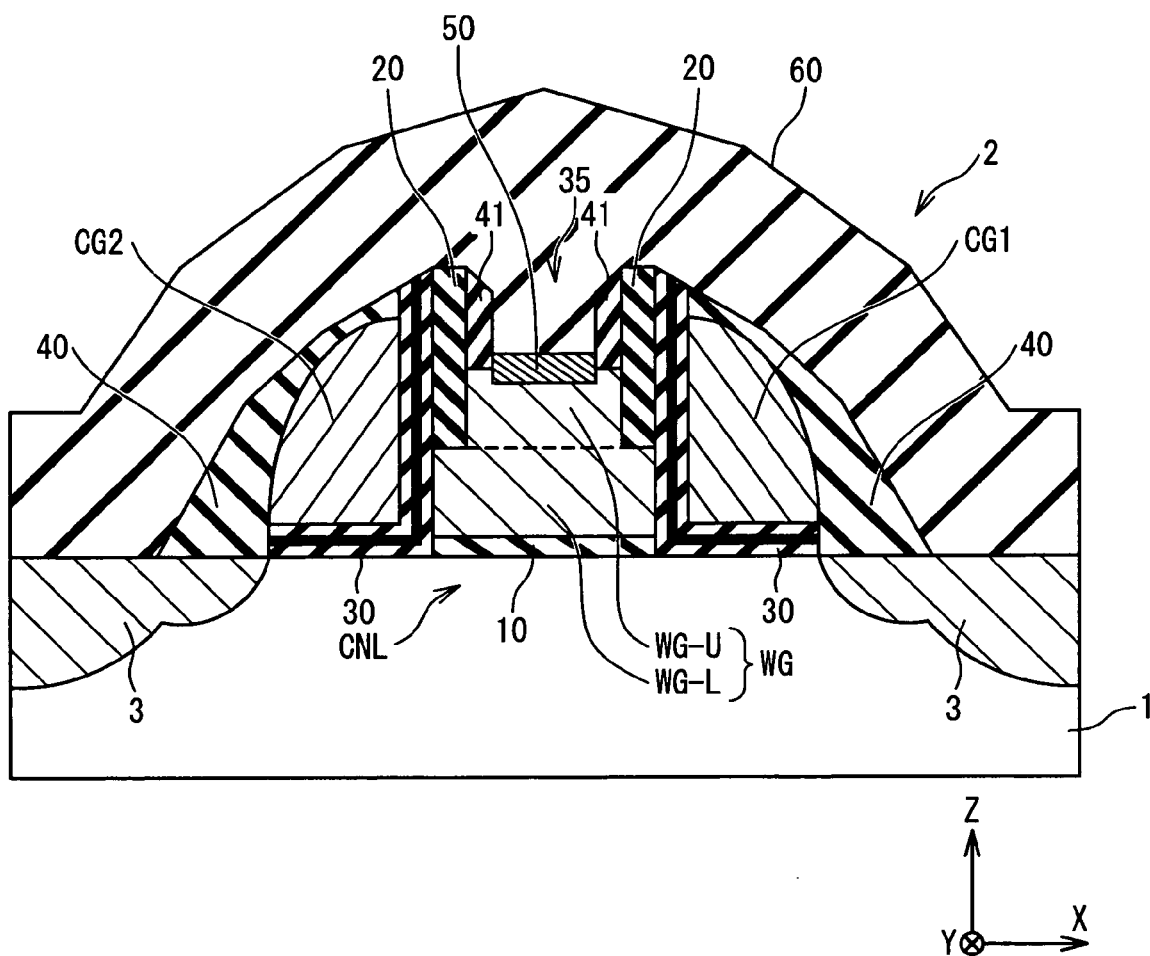
FIG. 7 is a cross sectional view showing a structure of the nonvolatile semiconductor memory device according to a second embodiment of the present invention.

FIG. 7 is a cross sectional view showing a structure of the nonvolatile semiconductor memory device according to a second embodiment of the present invention. In FIG. 7, the same numerals are assigned to the same components as those of the first embodiment, and redundant explanations will be arbitrarily omitted.

In the second embodiment, tops of the control gates CG1 and CG2 are formed to be higher than that of the word gate WG. As shown in FIG. 7, a groove portion 35 sandwiched by the spacer insulating films 20 exists above the word gate WG. In the groove portion 35, a side wall 41 is formed on each of side surfaces of the spacer insulating film 20. The silicide layer 50 is formed on an upper surface of the word gate WG to be sandwiched by the side walls 41.

The write, erase, and read operations to the memory cell 2 of the present embodiment are the same as those of the first embodiment.

Referring to FIGS. 8A to 8H, one example of a manufacturing process of the nonvolatile semiconductor memory device according to the present embodiment will be described. A part of the manufacturing process is the same as that of the first embodiment, thus its explanation will be omitted.

Figure 8A:
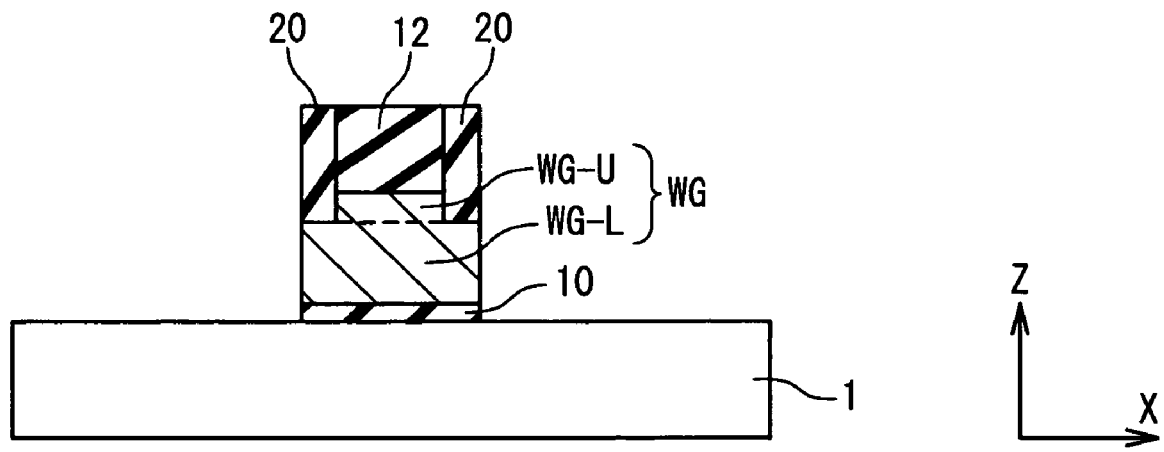
FIGS. 8A to 8H are cross sectional views showing a manufacturing process of the nonvolatile semiconductor memory device according to the second embodiment.
Figure 8B:
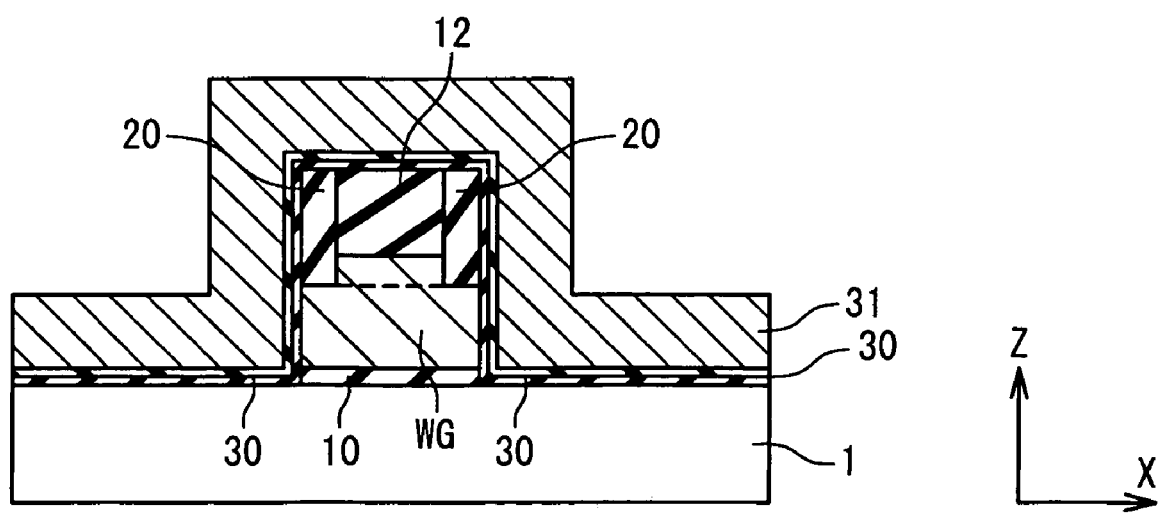

FIG. 8A shows a same step as that of already-shown FIG. 6F. However, comparing to FIG. 6F, the insulating film 12 for the hard masking is formed to be thicker. Next, as shown in FIG. 8B, the electric charge trapping layer 30 is formed on the entire surface. Furthermore, the polysilicon layer 31 is deposited on the electric charge trapping layer 30.

Figure 8C:
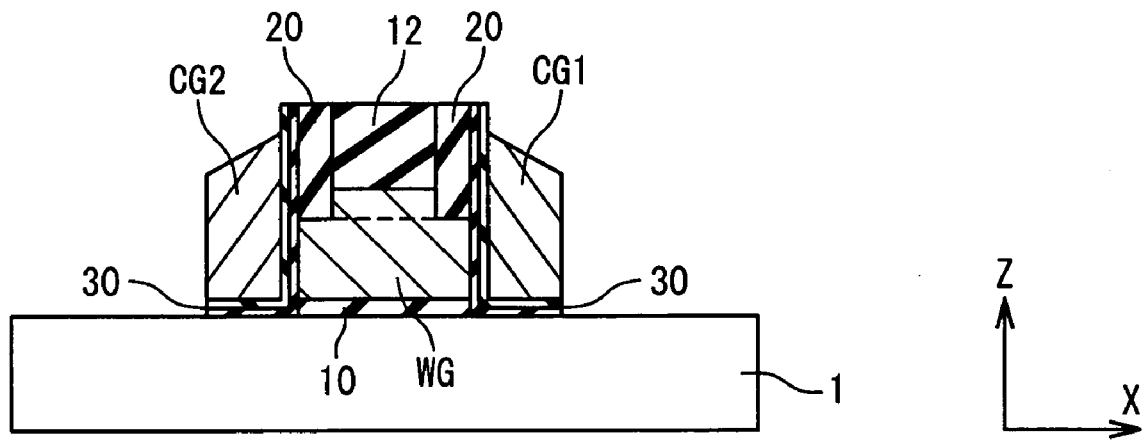

Subsequently, the etching back of the polysilicon layer 31 is performed. As a result, as shown in FIG. 8C, the control gates CG1 and CG2 are formed on both sides of the word gate WG. Upper surfaces of the control gates CG1 and CG2 are higher than the upper surface of the word gate WG. Further in this case, the electric charge trapping layer 30 is etched until a part of the semiconductor substrate 1 is exposed. Thus, the electric charge trapping films 30 are formed in an L-shape on both sides of the word gate WG. The insulating film 12 for the hard masking remains without being removed at a step of FIG. 8C.

Figure 8D:
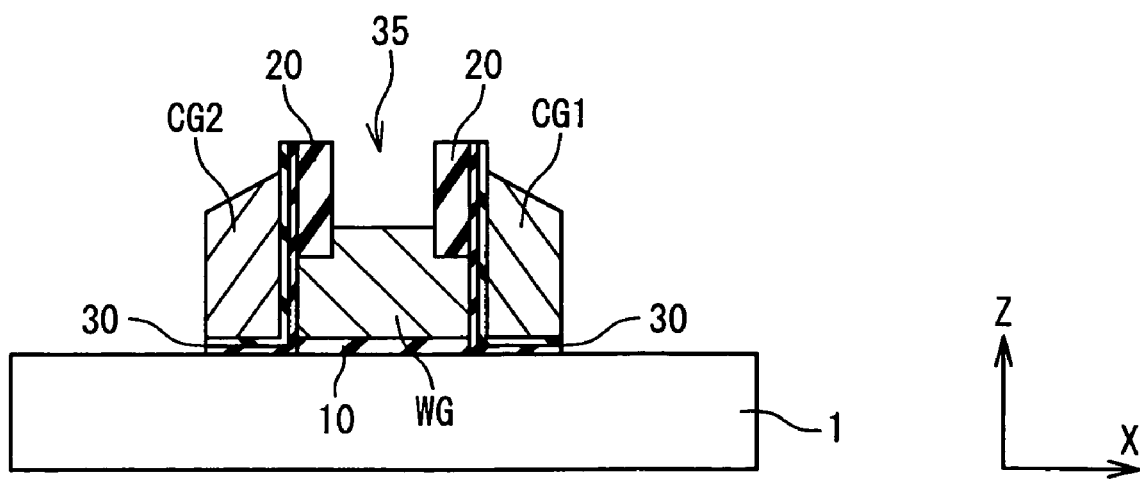

Next, as shown in FIG. 8D, the insulating film 12 is removed. As a result, the groove portion 35 is formed in a portion in which the insulating film 12 has existed. The groove portion 35 exists above the word gate WG, and further is sandwiched by the spacer insulating films 20.

Figure 8E:
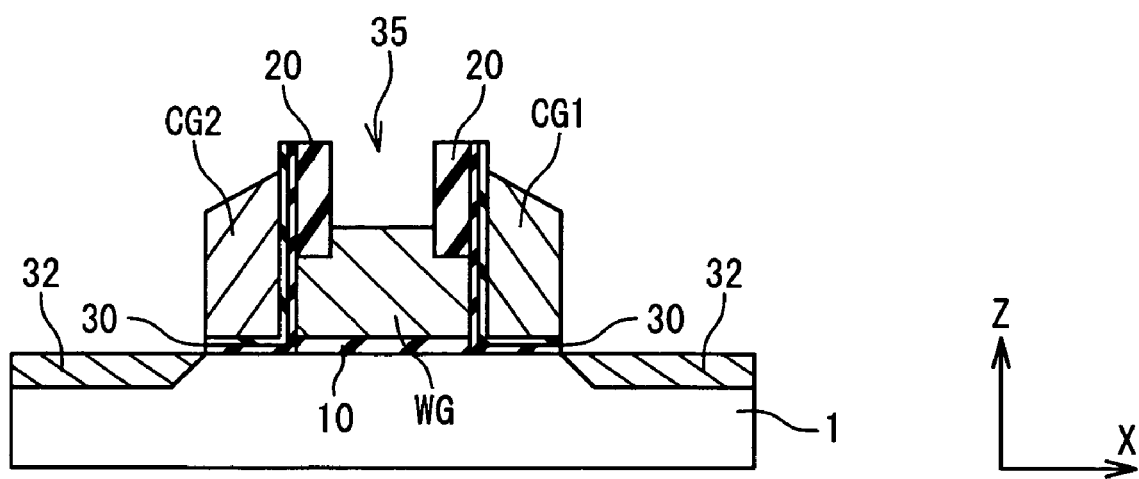

Next, the ion implantation process is performed, and the LDD structure 32 of the source/drain diffusion layers 3 is formed on the surface of the semiconductor substrate 1 as shown in FIG. 8E.

Figure 8F:
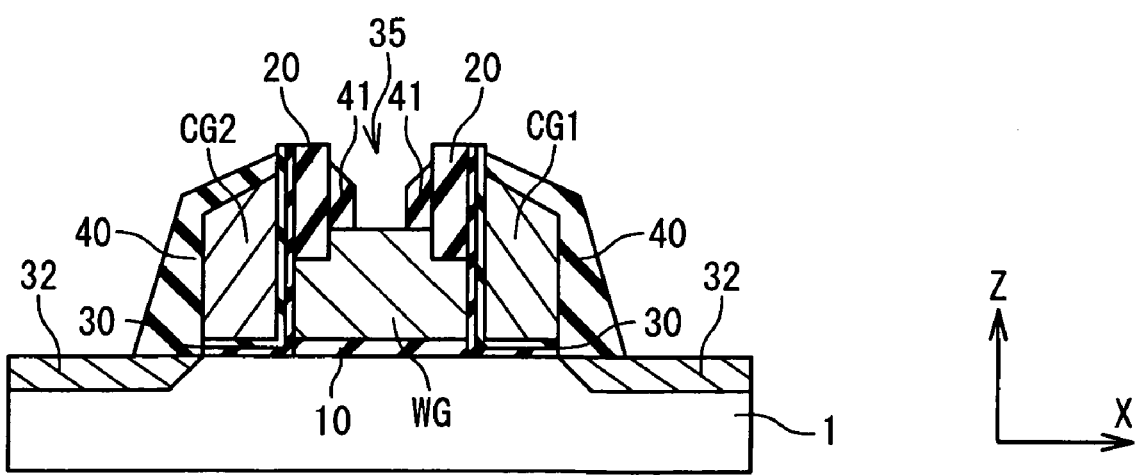

Next, after a silicon oxide layer is deposited on the entire surface, the etching back of the silicon oxide layer is performed. As a result, as shown in FIG. 8F, the side walls 40 are formed to cover the control gates CG 1 and CG2. Further, the side walls 41 are formed on the side surfaces of the spacer insulating films 20 in the groove portion 35.

Figure 8G:
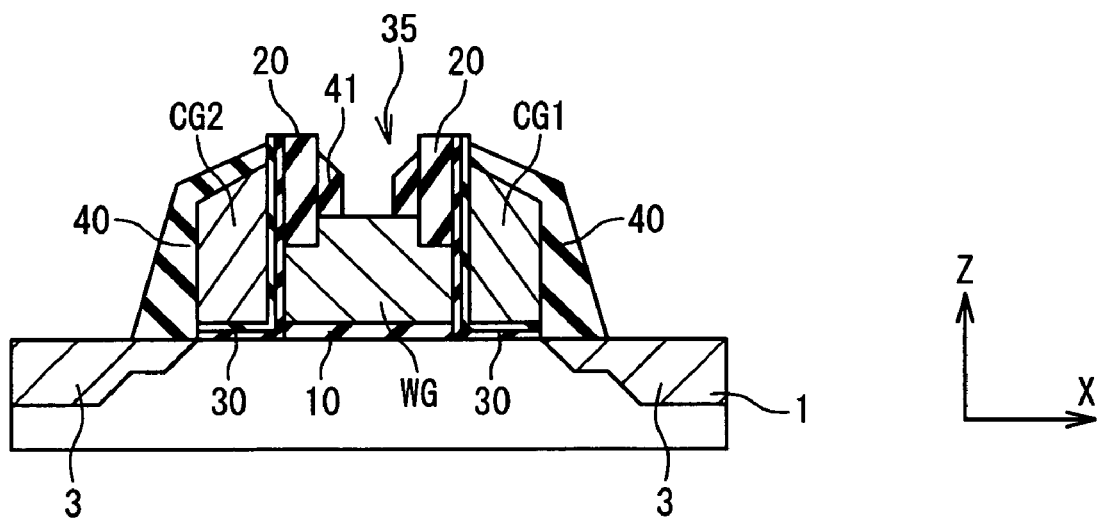

After that, the ion implantation process is performed, and the source/drain diffusion layers 3 are formed on the surface of the semiconductor substrate 1 as shown in FIG. 8G.

Figure 8H:
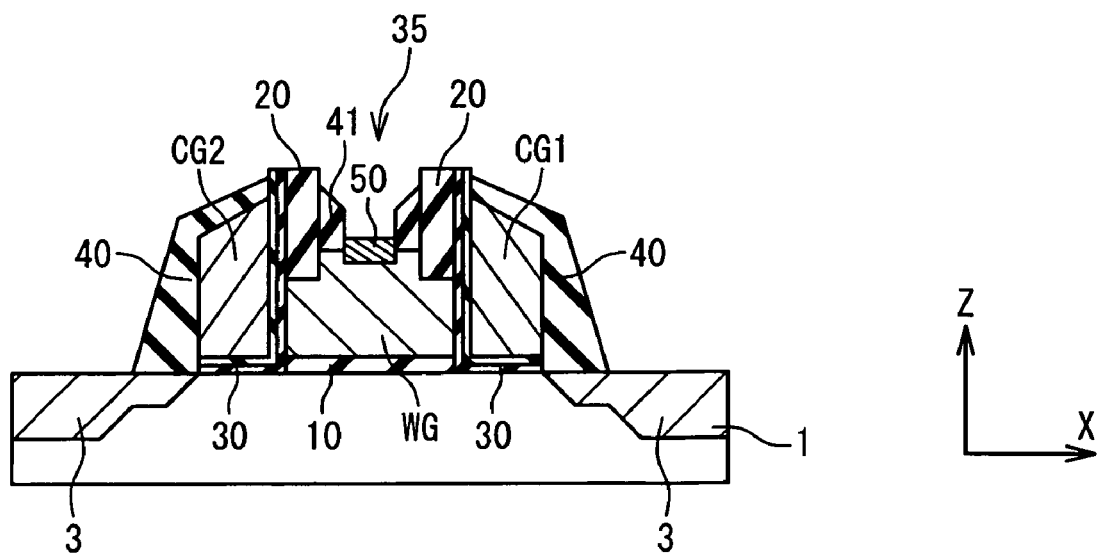

Next, as shown in FIG. 8H, the upper surface of the word gate WG is treated with the silicidation treatment, and the silicide layer 50 is formed. For example, a cobalt film is formed on the entire surface by the sputtering, and then a heat treatment is performed. A cobalt silicide layer is formed by the silicide reaction of the cobalt with the polysilicon of the word gate WG. The silicide layer 50 is formed to be sandwiched by the side walls 41.

After that, similar to the first embodiment, the interlayer insulating film 60 is formed on the entire surface. Thus, the structure shown in FIG. 7 is obtained.

According to the present embodiment, the same effect as that of the first embodiment is obtained. In addition, since the silicide layer 50 is formed on a bottom of the groove portion 35, the silicide layer 50 is prevented certainly from short-circuiting with another silicide layer.

Third Embodiment

In the already described embodiments, the structure for storing 2-bit data into one memory cell 2 has been showed. Naturally, a structure in which one memory cell 2 stores 1-bit data may be employed.

Figure 9:
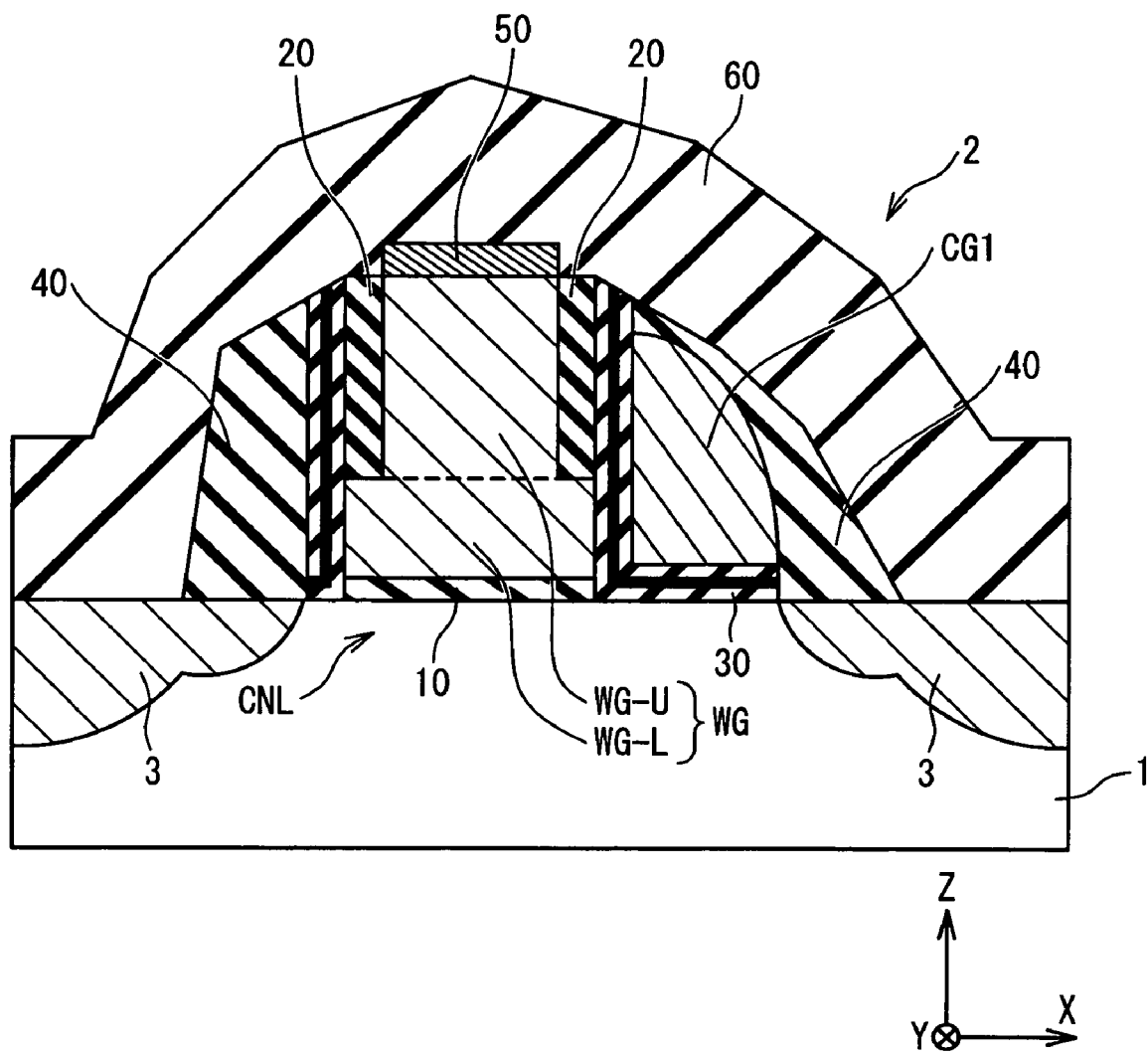
FIG. 9 is a cross sectional view showing a structure of the nonvolatile semiconductor memory device according to a third embodiment of the present invention.

FIG. 9 is a cross sectional view showing a structure of a nonvolatile semiconductor memory device according to a third embodiment of the present invention. In FIG. 9, the same numerals are assigned to the same components as those of the first embodiment, and redundant explanations will be arbitrarily omitted. As shown in FIG. 9, the control gate CG1 is formed on one side of the word gate WG and the control gate CG2 is not formed. Accordingly, one memory cell 2 stores only 1-bit data.

Figure 10A:
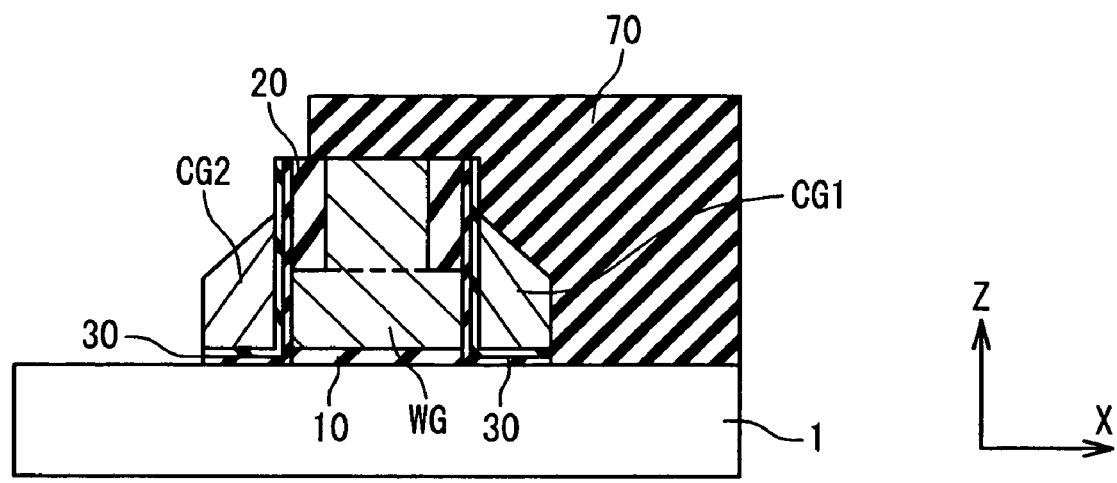
FIGS. 10A to 10C are cross sectional views showing a manufacturing process of the nonvolatile semiconductor memory device according to the third embodiment.
Figure 10B:
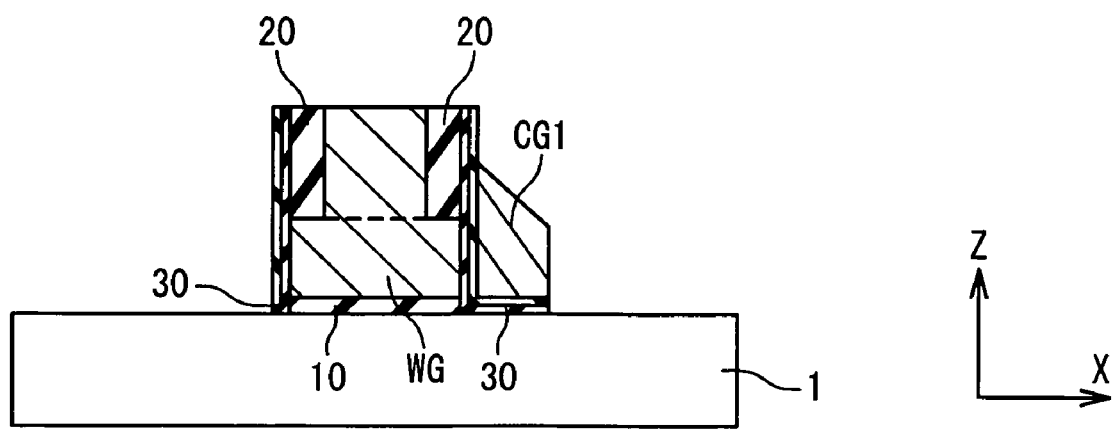
Figure 10C:
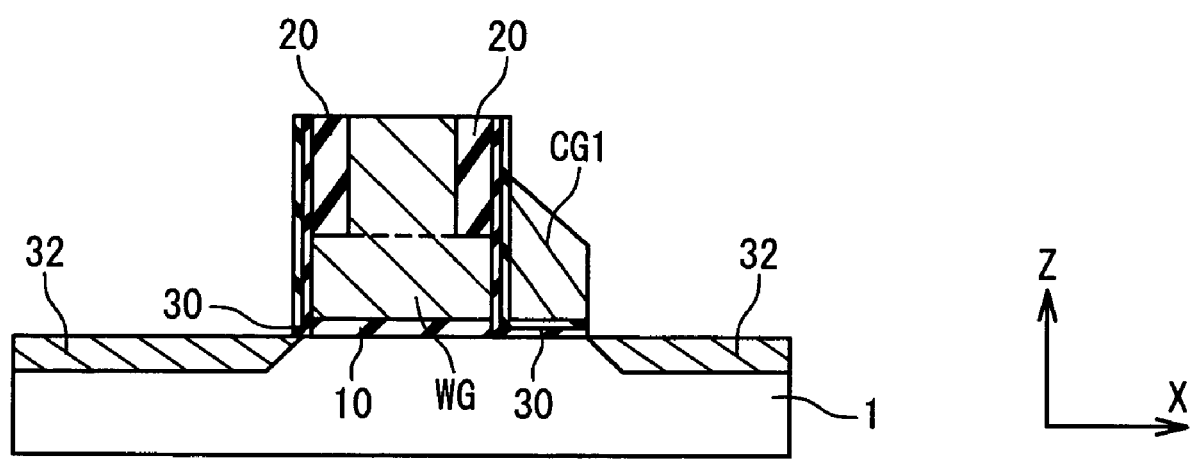

A manufacturing method of a structure shown in FIG. 9 is almost the same as that of the first embodiment. However, a process for removing the control gate CG2 is added. Specifically, as shown in FIG. 10A, a resist mask 70 covering the control gate CG1 and the word gate WG is formed starting from a state shown in FIG. 6H. The control gate CG2 is removed by the etching using the resist mask 70 (refer to FIG. 10B). After that, the LDD structure 32 of the source/drain diffusion layers 3 is formed on the surface of the semiconductor substrate 1 in the same process as that shown in FIG. 6I (refer to FIG. 10C). A subsequent process is the same as that of the first embodiment.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A nonvolatile semiconductor memory device, comprising:
    a semiconductor substrate;
    a first gate electrode formed on said semiconductor substrate through a gate insulating film;
    a second gate electrode, comprising a side portion, formed in a side direction of said first gate electrode and electrically insulated from said first gate electrode; and
    an electric charge trapping film formed at least between said semiconductor substrate and said second gate electrode to trap electric charge,
    wherein said first gate electrode comprises a lower portion contacting said gate insulating film and an upper portion above said lower portion of said first gate electrode,
    wherein a distance between said upper portion of said first gate electrode and said second gate electrode is greater than a distance between said lower portion of said first gate electrode and said second gate electrode, and
    wherein said electric charge trapping film and a spacer insulating film are sandwiched between said upper portion of said first gate electrode and said side portion of said second gate electrode.

2. The nonvolatile semiconductor memory device according to claim 1, wherein said electric charge trapping film exists between said first gate electrode and said second gate electrode, as well as between said semiconductor substrate and said second gate electrode.

3. The nonvolatile semiconductor memory device according to claim 2, wherein said electric charge trapping film is provided between said lower portion of said first gate electrode and said second gate electrode.

4. The nonvolatile semiconductor memory device according to claim 1, further comprising:
    a silicide layer formed on said first gate electrode.

5. The nonvolatile semiconductor memory device according to claim 4, wherein said silicide layer covers a surface of said upper portion of said first gate electrode.

6. The nonvolatile semiconductor memory device according to claim 4, wherein said silicide layer is provided on a surface of said first gate electrode.

7. The nonvolatile semiconductor memory device according to claim 1, wherein said second gate electrode is provided on each side of said first gate electrode.

8. The nonvolatile semiconductor memory device according to claim 1, wherein a section shape of said first gate electrode in a plane that is perpendicular to said semiconductor substrate and perpendicular to a direction in which said first gate electrode extends on a surface of said semiconductor substrate includes a convex shape.

9. The nonvolatile semiconductor memory device according to claim 1, wherein said distance between said lower portion of said first gate electrode and said second gate electrode is equal to a distance between said second gate electrode and said spacer insulating film.

10. The nonvolatile semiconductor memory device according to claim 1, wherein a distance between said semiconductor substrate and at least one surface of said upper portion of said first gate electrode is greater than a distance between said semiconductor substrate and all surfaces of said second gate electrode.

11. The nonvolatile semiconductor memory device according to claim 1, wherein a distance between said semiconductor substrate and all surfaces of said upper portion of said first gate electrode is less than a distance between said semiconductor substrate and at least one surface of said second gate electrode.

12. A nonvolatile semiconductor memory device, comprising:
    a semiconductor substrate;
    a first gate electrode formed on said semiconductor substrate through a gate insulating film;
    a second gate electrode formed in a side direction of said first gate electrode and electrically insulated from said first gate electrode; and
    an insulating film formed at least between said semiconductor substrate and said second gate electrode to trap electric charge, as an electric charge trapping film,
    wherein said first gate electrode comprises a lower portion contacting said gate insulating film and an upper portion above said lower portion of said first gate electrode,
    wherein a distance between said upper portion of said first gate electrode and said second gate electrode is longer than a distance between said lower portion of said first gate electrode and said second gate electrode, and
    wherein said electric charge trapping film comprises an ONO (Oxide Nitride Oxide) film.

* * * * *